(12) United States Patent  
Yasuda et al.

(10) Patent No.: US 8,115,125 B2
(45) Date of Patent: Feb. 14, 2012

(54) CORD SWITCH

(75) Inventors: Shuhei Yasuda, Hitachi (JP); Takashi Aoyama, Hitachi (JP); Akira Yamaura, Hitachi (JP); Tomiya Abe, Hitachi (JP)

(73) Assignee: Hitachi Cable, Ltd., Tokyo (JP)

( * ) Notice: Subject to any disclaimer, the term of this patent is extended or adjusted under 35 U.S.C. 154(b) by 525 days.

(21) Appl. No.: 12/272,334

(22) Filed: Nov. 17, 2008

(65) Prior Publication Data

US 2009/0133994 A1    May 28, 2009

(30) Foreign Application Priority Data

Nov. 22, 2007 (JP) .................. 2007-302885

(51) Int. Cl.
*H01H 3/16* (2006.01)

(52) U.S. Cl. .................. 200/61.43; 200/61.62

(58) Field of Classification Search ........... 200/61.62, 200/61.67, 61.43
See application file for complete search history.

(56) References Cited

U.S. PATENT DOCUMENTS

| | | | | |
|---|---|---|---|---|
| 2,843,694 A | * | 7/1958 | Bertaux | 200/86 R |
| 3,321,592 A | * | 5/1967 | Miller | 200/61.43 |
| 5,072,079 A | * | 12/1991 | Miller | 200/61.43 |
| 5,860,513 A | * | 1/1999 | Suzuki | 200/268 |
| 6,078,014 A | | 6/2000 | Kashiwazaki et al. | |
| 6,166,338 A | * | 12/2000 | Ebato | 200/61.43 |
| 6,225,556 B1 | * | 5/2001 | Saito | 174/36 |
| 6,316,846 B1 | | 11/2001 | Kashiwazaki et al. | |
| 6,739,198 B2 | * | 5/2004 | Suzuki et al. | 73/753 |
| 7,055,885 B2 | * | 6/2006 | Ishihara et al. | 296/146.4 |
| 7,355,123 B2 | * | 4/2008 | Kimura et al. | 174/102 R |
| 7,534,957 B2 | * | 5/2009 | Yamaura et al. | 174/36 |
| 2007/0117445 A1 | | 5/2007 | Yamaura et al. | |

FOREIGN PATENT DOCUMENTS

JP    2007-123202 A    5/2007
WO    WO 97/21235 A1    6/1997

\* cited by examiner

*Primary Examiner* — Elvin G Enad
*Assistant Examiner* — Lisa Homza
(74) *Attorney, Agent, or Firm* — Foley & Lardner LLP

(57) ABSTRACT

A cord switch includes a hollow insulation having a restoring force, a plurality of inner electrode wires provided along an inner surface of the hollow insulation, and an outer electrode provided on an outer surface of the hollow insulation. The outer electrode includes a plurality of outer electrode wires wounded on the outer surface of the hollow insulation, the outer electrode wires each including a copper wire and a plated layer formed on a surface of the copper wire, and the plated layer includes a transition metal except cobalt, manganese, copper, iron and vanadium, or a typical metal.

12 Claims, 3 Drawing Sheets

CORD SWITCH

The present application is based on Japanese Patent Application No. 2007-302885 filed on Nov. 22, 2007, the entire contents of which are incorporated herein by reference.

BACKGROUND OF THE INVENTION

1. Field of the Invention

The present invention relates to a cord switch suitable as an object detection sensor for detecting an object or a person being stuck in or close to being stuck in an automatic door or the like.

2. Related Art

For example, some vehicles are provided with a sensor attached to an edge of power sliding door, a power rear door or the like such that it detects a state that an object or a person is caught or close to being caught between the door and the vehicle body so as to open the door for safety.

Such a sensor includes a cord switch, and a cord switch of contact type is known in which ON/OFF operation is conducted in response to contact between plural electrode wires caused by pressure changes occurring when an object contacts a power window or door (e.g., WO 97/21235).

FIG. 4 shows the structure of a conventional cord switch disclosed in WO 97/21235. This cord switch 40 has the structure that four electrode wires 42 are circumferentially disposed at predetermined intervals on the inner periphery of a hollow insulation 41 with a restoring force, and the electrode wires 42 are each helically arranged in the longitudinal direction.

The hollow insulation 41 is formed of a material, e.g., a restoring rubber or restoring plastic, that holds the electrode wires 42 not to electrically contact each other when external force is not in action, is easily deformed by the external force to allow the electrode wires 42 to electrically contact each other, and is restored immediately when the external force is removed.

The electrode wire 42 is composed such that a conductive rubber layer or a conductive plastic layer 44 is formed on the outer periphery of a metal layer 43 formed of one or multiple stranded wires.

Further, a combined contact/contactless cord switch is known in which outer electrodes are disposed on the periphery of the contact-type cord switch 40 such that a capacitive contactless detection function is added as the contact detection function (e.g., JP-A-2007-123202).

FIG. 5 shows the structure of the combined contact/contactless cord switch in JP-A 2007-123202. The cord switch 50 is composed such that outer electrodes 51 are formed by laterally winding thin copper wires on the outer periphery of the conventional cord switch 40 in FIG. 4, and a sheath 55 covers the outer electrodes 51 for protecting the outer electrodes 51.

When an object approaches the cord switch 50, capacitance formed between inner electrode wires 52 and the outer electrodes 51 varies due to floating capacitance formed between the approaching object and the outer electrodes 51. By reading the variation of the capacitance, contactless detection of the object can be conducted.

However, since the conventional combined contact/contactless cord switch 50 may be exposed to high-temperature environment in case of a vehicle, an outdoor use or the like, a problem may arise that ON-resistance in turning on the cord switch 50 increases to deteriorate the detection sensitivity when the inner electrode wire 52 contacts the other inner electrode wire 52 due to being under the high-temperature environment for a long time.

The main cause of this problem is metal ion damage that a transition metal causes deterioration of an insulation (or polymer).

The metal ion damage is a phenomenon that a metal ion facilitates deterioration of a polymer (e.g., rubber, plastic) as an insulation, where a polymer deteriorates by a metal ion having catalysis (redox reaction) such that it facilitates auto-oxidation reaction of the polymer.

When the cord switch 50 is under the high-temperature environment for a long time, a hollow insulation 53 formed of a polymer deteriorates by the metal ion damage caused by a transition metal composing the outer electrode 51 such as copper etc. It is assumed that a low molecular component (antioxidant etc.) contained in the deteriorated hollow insulation 53 moves into a conductive rubber 54 of the inner electrode wire 52, the conductive rubber 54 swells to increase the volume resistivity of the conductive rubber 54. Here, "volume resistivity" is defined as an electrical resistance per unit volume.

SUMMARY OF THE INVENTION

It is an object of the invention to provide a combined contact/contactless cord switch that ON-resistance thereof is less likely to increase even when it is kept under a high-temperature environment for a long time.

According to one embodiment of the invention, a cord switch comprises:

a hollow insulation having a restoring force;

a plurality of inner electrode wires provided along an inner surface of the hollow insulation; and an outer electrode provided on an outer surface of the hollow insulation, wherein the outer electrode comprises a plurality of outer electrode wires wounded on the outer surface of the hollow insulation, the outer electrode wires each comprising a copper wire and a plated layer formed on a surface of the copper wire, and the plated layer comprises a transition metal except cobalt, manganese, copper, iron and vanadium, or a typical metal.

In the above embodiment, the following modifications and changes can be made.

(i) The plated layer comprises tin, and the plated layer is 0.5 μm or more in thickness.

(ii) The plated layer comprises one of nickel, silver, aluminum and zinc, and the plated layer is 0.3 μm or more in thickness.

(iii) The plated layer comprises a first plated layer formed on an outer surface of each of the plurality of outer electrode wires and a second plated layer formed on an outer surface of the first plated layer, the first plated layer comprises a metal having an interdiffusion coefficient with respect to copper smaller than tin, and the second plated layer comprises a metal having a metal ion damage less than the first plated layer.

(iv) The plated layer comprises a transition metal less in metal ion damage than vanadium, or a typical metal.

(v) The plated layer comprises tin or a metal smaller in interdiffusion coefficient with respect to copper than tin.

BRIEF DESCRIPTION OF THE DRAWINGS

Next, the present invention will be explained in more detail in conjunction with appended drawings, wherein.

DESCRIPTION OF THE PREFERRED EMBODIMENTS

The embodiment according to the invention will be explained below in conjunction with the appended drawings.

First Embodiment

Figure 1:
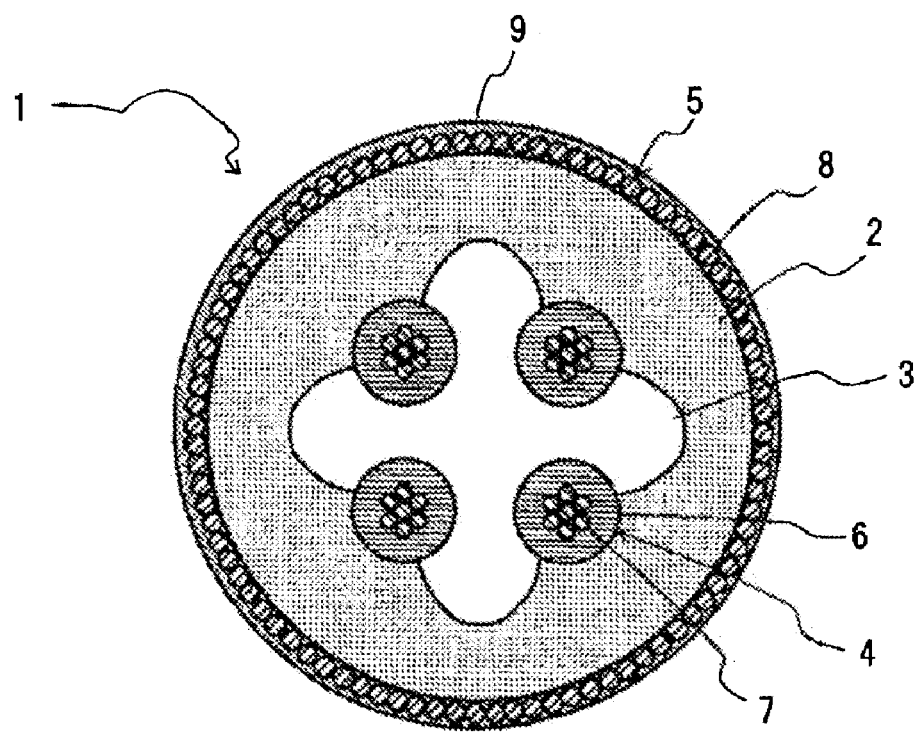
FIG. 1 is a lateral cross-sectional view of a cord switch in a first preferred embodiment according to the invention.

FIG. 1 is a lateral cross-sectional view of a cord switch in the first preferred embodiment according to the invention.

As shown in FIG. 1, a cord switch 1 of the first embodiment is mainly composed of a hollow insulation 2 having a restoring force, four inner electrode wires 4 disposed along a hollow portion 3 of the hollow insulation 2, and an outer electrode 5 provided on the outer surface of the hollow insulation 2 for forming a floating capacitance between an approaching object and the outer electrode 5 when the object comes close to the cord switch 1.

The hollow insulation 2 is preferably formed of a material which is easily deformed by external force and restored immediately when the external force is removed. For example, in terms of shore A hardness complying with the international standard used for measuring the hardness of rubber, it is preferably formed of a restoring rubber with a shore A hardness of 30 to 70 (e.g., silicone rubber, ethylene-propylene rubber etc.) or a restoring plastic (e.g., polyethylene, ethylene-vinyl copolymer etc.). In the first embodiment, the hollow insulation 2 is formed of an ethylene-propylene rubber.

On the inner surface of the hollow insulation 2, the four inner electrode wires 4 are disposed circumferentially at predetermined intervals. The inner electrode wires 4 are each helically disposed in the longitudinal direction along the inner surface of the hollow insulation 2 while keeping the predetermined intervals.

The inner electrode wire 4 is composed of a core wire 7 with seven copper wires stranded and a conductive resin 6 coating the outer surface of the core wire 7, and formed circular in a cross-section orthogonal to the longitudinal direction of the inner electrode wire 4. Silver or nickel is plated on the outer surface of the copper wire used for the core wire 7 so as to prevent the formation of an insulating layer (or void) between the core wire 7 and the conductive resin 6 during the extrusion molding.

The conductive resin 6 is preferably formed of, e.g., rubber or plastic with a conductive filler such as carbon black or the like mixed thereinto to impart conductivity.

On the outer surface of the hollow insulation 2, the outer electrode 5 is formed by helically winding (e.g., laterally winding) the plural outer electrode wires 8 along the longitudinal direction of the hollow insulation 2.

Figure 2:
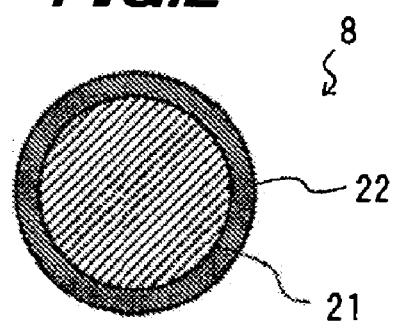
FIG. 2 is a lateral cross-sectional view of an outer electrode wire used for the cord switch in the first embodiment.

As shown in FIG. 2, the outer electrode wire 8 used for the cord switch 1 of the first embodiment is produced by forming a plated layer 22 on the surface of a thin copper wire 21.

The plated layer 22 is formed of a transition metal excluding cobalt, manganese, copper, iron and vanadium, or a typical metal. The transition metal is preferably nickel or silver, and the typical metal is preferably aluminum, tin and zinc.

The thickness of the plated layer 22 is determined by an interdiffusion coefficient between copper of the copper wire 21 and a material of the plated layer 22. If the material of the plated layer 22 is tin, the thickness thereof should be 0.5 μm or more. This is because, if the thickness of the plated layer 22 is less than 0.5 μm, the copper of the copper wire 21 diffuses and reaches the outer surface of the plated layer 22 when keeping the cord switch 1 at high temperature, and the metal ion damage (copper damage) occurs due to the copper, whereby the hollow insulation 2 deteriorates.

When the plated layer 22 is formed of nickel, silver, aluminum or zinc having an interdiffusion coefficient with respect to copper smaller than tin, the thickness of the plated layer 22 is preferably 0.3 μm or more.

The upper limit of the thickness of the plated layer 22 is appropriately determined such that it does not affect the flexibility of the cord switch 1.

A sheath 9 for insulating and protecting the outer electrode 5 is formed on the outer surface of the outer electrode 5. The sheath 9 is preferably formed of, e.g., urethane, polyvinyl chloride, rubbers such as epoxy resin rubber and silicone rubber, elastomer, or, polyethylene terephthalate (PET).

The operation of the cord switch 1 attached to, e.g., a slide door of a vehicle will be explained below.

If a human body or an object contacts the cord switch 1 attached to a sliding door when closing the sliding door of the vehicle, a contact portion of the cord switch 1 is deformed by external force. When the external force is large, the hollow insulation 2 is flattened, whereby the inner electrode wires 4 contact each other in the hollow portion 3. The contact to the human body or the object is detected by detecting a variation in current between the inner electrode wires 4 due to this contact of the inner electrode wires 4. Since the inner electrode wires 4 are helically arranged in the longitudinal direction along the inner surface of the hollow insulation 2, the cord switch 1 can detect pressure from all directions.

On the other hand, in the cord switch 1, a capacitance C is always formed between the outer electrode 5 and the inner electrode wire 4. When the human body or the object comes close to the cord switch 1, a floating capacitance $\Delta C$ is formed between the outer electrode 5 and the human body or the object. The approach of the human body or the object is detected, in contactless manner, by measuring the sum ($\Delta C$ + C) of the floating capacitance $\Delta C$ and the capacitance C between the outer electrode 5 and the inner electrode wire 4 and by detecting the change of the sum.

When the contact or the approach of the human body or the object is detected by the cord switch 1, the sliding door can be opened to prevent the human body or the object from being stuck in.

The functions or effects of the first embodiment will be explained below.

In the cord switch 1 of the first embodiment, the plated layer 22 of the outer electrode wire 8 is formed of a transition metal except cobalt, manganese, copper, iron and vanadium, or of a typical metal.

In general, copper and any of the transition metals have an action (i.e., metal ion damage) to cause deterioration of an insulation (or a polymer) although there is a difference in degree of influence. The degree of influence in metal ion damage among elements is as shown below.

Namely, when a transition metal such as cobalt, manganese, copper, iron and vanadium having a large degree of influence in metal ion damage is used for the plated layer 22, the hollow insulation 2 formed of a rubber or plastic as a polymer deteriorates. A low molecular component (antioxidant, etc.) in the deteriorated hollow insulation 2 moves into the conductive resin 6 to increase the volume resistivity of the conductive resin 6 and to increase ON-resistance when the inner electrode wires 4 contact each other. Therefore, cobalt, manganese, copper, iron and vanadium should not be used for the plated layer 22. In other words, a transition metal with the metal ion damage less than vanadium should be used for the plated layer 22.

In general, it is known that typical metals are less likely to cause deterioration of an insulation (a polymer) as compared to transition metals consisting of cobalt, manganese, copper, iron and vanadium.

Therefore, in the cord switch 1, the plated layer 22 is formed of transition metals except cobalt, manganese, copper, iron and vanadium with a large degree of influence in metal ion damage, or the typical metals having less action to cause the deterioration of an insulation. Thereby, it is possible to suppress the deterioration of the hollow insulation 2 to prevent an increase in the ON-resistance.

Further, in the cord switch 1 of the first embodiment, the plated layer 22 is formed of a transition metal including nickel or silver or a typical metal including aluminum, tin or zinc. Since nickel, silver, aluminum, tin and zinc are widely used as a plating material, they are easily available.

In the cord switch 1, when the plating material of the outer electrode wire 8 is tin, the thickness of the plated layer 22 is set to be 0.5 μm or more. Thereby, since the copper of the copper wire 21 is prevented from diffusing up to the surface of the plated layer 22 even when kept at high temperature for a long time, it is possible to suppress the deterioration of the hollow insulation 2 due to the metal ion damage to prevent an increase in the ON-resistance.

Especially when the plated layer 22 is formed of nickel, since nickel has an interdiffusion coefficient with respect to copper smaller than tin, it is possible to allow the copper of the copper wire 21 to diffuse up to the outer surface of the plated layer 22 less than the tin plating even when kept at high temperature for a long time. Furthermore, since nickel is much slower in the speed of deterioration of the hollow insulation 2 than copper, it is possible to suppress the deterioration of the hollow insulation 2 to prevent an increase in the ON-resistance.

In electric wires composed of a core wire and an insulation coated thereon, the core wire is conventionally plated by tin, nickel, silver or the like. However, the conventional plated layer is intended to improve electrical connectivity for the solder bonding and to prevent an increase in conduction resistance of the core wire caused by oxidation or corrosion thereof. Thus, unlike the present invention, it does not aim to prevent the deterioration of an insulation (or a polymer) caused by the metal ion damage.

Second Embodiment

The second preferred embodiment according to the invention will be explained below.

Figure 3:
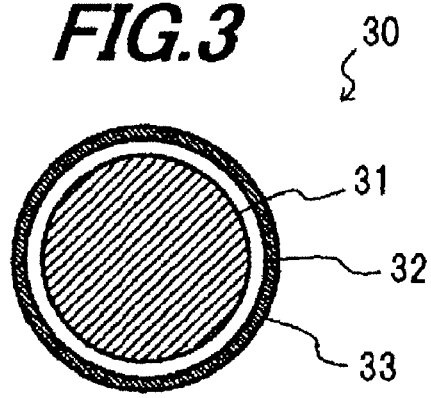
FIG. 3 is a lateral cross-sectional view of an outer electrode wire used for a cord switch in a second preferred embodiment according to the invention.
Figure 4:
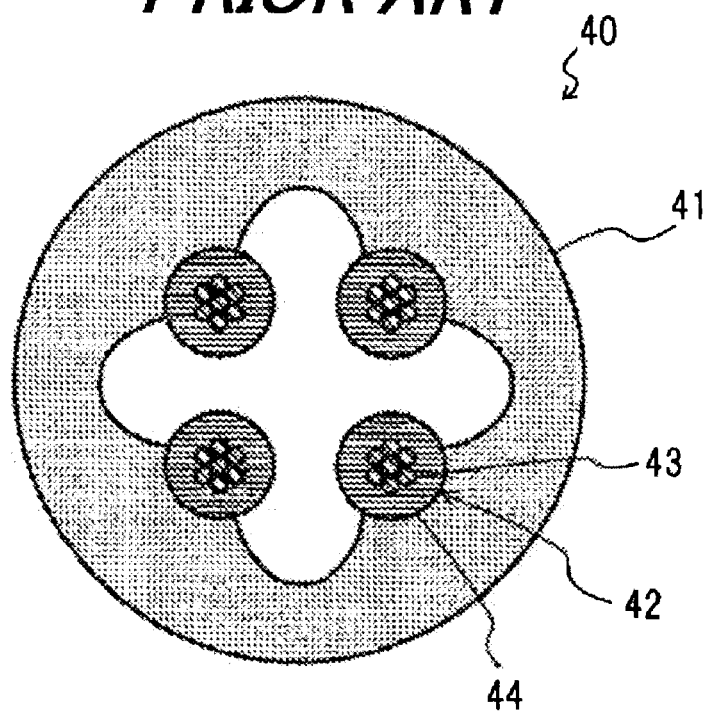
FIG. 4 is a lateral cross-sectional view of the conventional cord switch.
Figure 5:
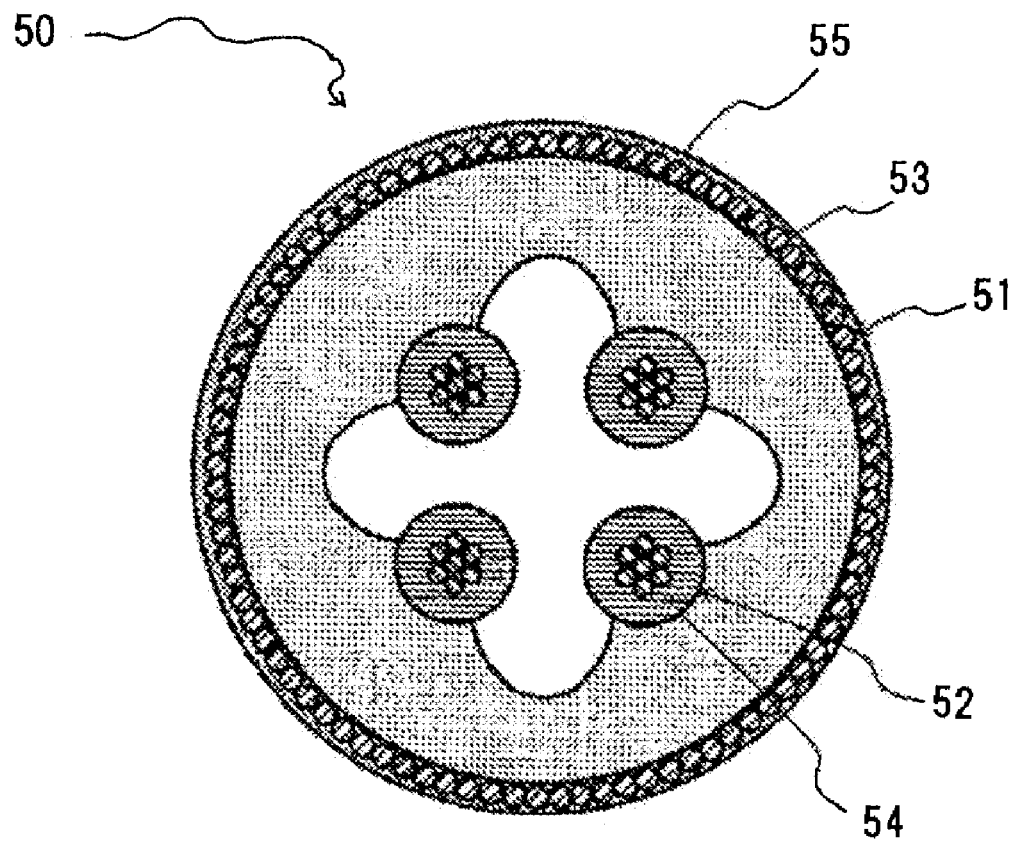
FIG. 5 is a lateral cross-sectional view of the conventional cord switch.

A cord switch of the second embodiment is substantially the same as the cord switch 1 of the first embodiment, except that an outer electrode wire 30 shown in FIG. 3 is, instead of the outer electrode wire 8, used for the outer electrode 5.

As shown in FIG. 3, the outer electrode wire 30 used for the cord switch of the second embodiment is composed such that a first plated layer 32 is formed on a surface of a thin copper wire 31 and a second plated layer 33 is formed on the outer surface of the first plated layer 32.

The first plated layer 32 is preferably a metal having an interdiffusion coefficient with respect to copper smaller than tin. Since the second plated layer 33 is used to contact an insulation (or a polymer), it is suitably formed of a metal causing the metal ion damage less than the first plated layer 32.

For example, since the interdiffusion coefficient of copper and nickel is smaller than that of copper and tin, it is possible to prevent the copper of the copper wire 31 from diffusing up to the outer surface of the first plated layer 32 when the first plated layer 32 is formed of nickel. Further, when the second plated layer 33 is formed of a metal such as tin, aluminum, silver or the like less likely to cause deterioration of an insulation (or a polymer) than nickel, it is possible to suppress the deterioration of the hollow insulation 2 to preventing an increase in ON-resistance.

Furthermore, the double plated layer (composed of the layers 31, 32) is allowed to be formed thinner than a single plated layer since they each have the different functions (i.e., the smaller interdiffusion coefficient and less insulation deterioration), whereby the production time can be shortened.

In the above embodiments, the four inner electrode wires 4 are provided in the hollow portion 3. Alternatively, the inner electrode wires 4 may be provided two, three or more than four in the hollow portion 3.

EXAMPLES

Example 1

2 m of the cord switch 1 shown in FIG. 1 was produced.

The outer electrode 5 is formed by helically winding the 94 soft copper wires 21, each of which is 0.05 mm in diameter, around the hollow insulation 2. The soft copper wires 21 are each provided with the electrically tin-plated layer 22 with a thickness of 1.0 μm formed thereon. The hollow insulation 2 is formed of ethylene-propylene rubber, and the inner electrode wire 4 is composed such that the core wire 7 formed of stranded seven silver-plated copper wires with a diameter of 0.127 mm is coated with the conductive resin 6 having volume resistivity of 0.6Ω·cm.

Example 2

The outer electrode 5 is formed by helically winding the 94 soft copper wires 21, each of which is 0.05 mm in diameter, around the hollow insulation 2. The soft copper wires 21 are each provided with the electrically tin-plated layer 22 with a thickness of 0.5 μm formed thereon. The other components are the same as Example 1.

Example 3

The outer electrode 5 is formed by helically winding the 94 soft copper wires 21, each of which is 0.1 mm in diameter, around the hollow insulation 2. The soft copper wires 21 are each provided with the electrically tin-plated layer 22 with a thickness of 1.5 μm formed thereon. The other components are the same as Example 1.

Comparative Example 1

The outer electrode 5 is formed by helically winding the 94 soft copper wires 21, each of which is 0.05 mm in diameter, around the hollow insulation 2. No plated layer is formed on the copper wire 21. The other components are the same as Example 1.

Comparative Example 2

The outer electrode 5 is formed by helically winding the 94 soft copper wires 21, each of which is 0.05 mm in diameter, around the hollow insulation 2. The soft copper wires 21 are each provided with the hot-dipped tin-plated layer 22 with a thickness of 0.3 μm formed thereon. The other components are the same as Example 1.

ON-resistances before and after heating in a constant-temperature bath at 100° C. for 2000 hours are measured such that the cord switches of Examples 1 to 3 and Comparative Examples 1 and 2 are pressed at a 20 N load by a round bar with a tip of φ0.4 mm and ON-resistance is measured after 10 seconds while being pressed. The results are as shown in Table 1.

TABLE 1

|  | Example 1 | Example 2 | Example 3 | Comparative Example 1 | Comparative Example 2 |
|---|---|---|---|---|---|
| Initial | 5.0 Ω | 5.0 Ω | 5.0 Ω | 5.0 Ω | 5.0 Ω |
| After heating | 19 Ω | 25 Ω | 23 Ω | 2.6 kΩ | 2.4 kΩ |

As shown in Table 1, comparing the ON-resistances before and after heating in the constant-temperature bath, the ON-resistance, which is 5Ω before heating, becomes 19Ω which is equivalent to 3.8 times in Example 1, 25Ω which is equivalent to 5.0 times in Example 2, and 23Ω which is equivalent to 4.6 times in Example 3.

In contrast, comparing the ON-resistances before and after heating in the constant-temperature bath, the ON-resistance changes from 5Ω (initial) to 2.6 kΩ which is equivalent to 520 times in Comparative Example 1, and from 5Ω (initial) to 2.4 kΩ which is equivalent to 480 times in Comparative Example 2. Thus, these exhibit an increase rate much higher than Example 1.

From the above results, it is confirmed that increase of the ON-resistance after heating can be greatly reduced by forming tin plating with a thickness of 0.5 μm on the surface of the outer electrode 5.

Furthermore, the plated layer formed of a typical metal such as silver, zinc, aluminum having an interdiffusion coefficient with respect to copper smaller than tin, or formed of a transition metal (except cobalt, manganese, copper, iron and vanadium) such as nickel can suppress an increase in the ON-resistance at a film thickness of 0.3 μm or more.

In case of the two-layer structure where the first plated layer 32 is formed of nickel and the second plated layer 33 is formed of a metal causing the metal ion damage less than nickel, it is possible to suppress an increase in the ON-resistance for a long period as compared to a single plated layer.

Although the invention has been described with respect to the specific embodiments for complete and clear disclosure, the appended claims are not to be therefore limited but are to be construed as embodying all modifications and alternative constructions that may occur to one skilled in the art which fairly fall within the basic teaching herein set forth.

What is claimed is:

1. A cord switch, comprising:
a hollow insulation comprising a polymer to be subjected to metal ion damage and having a restoring force;
a plurality of inner electrode wires provided along an inner surface of the hollow insulation, each of the inner electrode wires comprising a core wire including a conductor and a conductive resin coated on an outer surface of the core wire; and
an outer electrode provided on an outer surface of the hollow insulation,
wherein the outer electrode comprises a plurality of outer electrode wires wound on the outer surface of the hollow insulation, the outer electrode wires each comprising a copper wire and a plated layer formed on a surface of the copper wire,
wherein the plated layer comprises a first plated layer formed on an outer surface of each of the plurality of outer electrode wires and a second plated layer formed on an outer surface of the first plated layer,
wherein the first plated layer comprises a metal selected from a group consisting of aluminum, zinc, and a transition metal except cobalt, manganese, copper, iron and vanadium, wherein the metal has an interdiffusion coefficient with respect to copper that is smaller than an interdiffusion coefficient of tin with respect to copper,
wherein the second plated layer comprises a metal selected from a group consisting of aluminum, tin, zinc, and a transition metal except cobalt, manganese, copper, iron and vanadium, wherein the second plated layer exhibits metal ion damage less than the first plated layer.

2. The cord switch according to claim 1, wherein the polymer comprises a rubber or a plastic.

3. The cord switch according to claim 1, wherein the polymer comprises a restoring rubber or a restoring plastic.

4. The cord switch according to claim 1, wherein the first plated layer comprises nickel and the second plated layer comprises tin, aluminum, or silver.

5. The cord switch according to claim 1, wherein the metal of the first plated layer excludes nickel.

6. The cord switch according to claim 1, wherein the metal of the second plated layer excludes silver.

7. The cord switch according to claim 5, wherein the metal of the second plated layer excludes silver.

8. A cord switch, comprising:
a hollow insulation having a restoring force;
a plurality of inner electrode wires provided along an inner surface of the hollow insulation; and
an outer electrode provided on an outer surface of the hollow insulation,
wherein the outer electrode comprises a plurality of outer electrode wires wound on the outer surface of the hollow insulation, the outer electrode wires each comprising a copper wire and a plated layer formed on a surface of the copper wire,
wherein the plated layer comprises a first plated layer formed on an outer surface of each of the plurality of outer electrode wires and a second plated layer formed on an outer surface of the first plated layer,
wherein the first plated layer comprises a metal selected from a group consisting of a main group metal except tin and a transition metal except cobalt, manganese, copper, iron and vanadium, wherein the metal has an interdiffusion coefficient with respect to copper that is smaller than an interdiffusion coefficient of tin with respect to copper, wherein the second plated layer comprises a metal selected from a group consisting of a main group metal and a transition metal except cobalt, manganese, copper, iron and vanadium, wherein the second plated layer exhibits metal ion damage less than the first plated layer.

9. The cord switch according to claim 8, wherein the first plated layer comprises nickel and the second plated layer comprises tin, aluminum, or silver.

10. The cord switch according to claim 8, wherein the metal of the first plated layer excludes nickel.

11. The cord switch according to claim 8, wherein the metal of the second plated layer excludes silver.

12. The cord switch according to claim 10, wherein the metal of the second plated layer excludes silver.

* * * * *